(12) United States Patent
Dulle et al.

(10) Patent No.: US 10,030,300 B2
(45) Date of Patent: Jul. 24, 2018

(54) SUBSTRATE COATING ON ONE OR MORE SIDES

(75) Inventors: Karl-Heinz Dulle, Olfen (DE); Frank Funck, Oberhausen (DE); Dirk Hoormann, Werne a.d. Lippe (DE); Stefan Oelmann, Schwerte-Ergste (DE); Peter Woltering, Neuenkirchen (DE); Carsten Schmitt, Hagen (DE); Philipp Hofmann, Dortmund (DE); Ulf-Steffen Baeumer, Unna (DE)

(73) Assignee: THYSSENKRUPP INDUSTRIAL SOLUTIONS AG, Essen (DE)

( * ) Notice: Subject to any disclaimer, the term of this patent is extended or adjusted under 35 U.S.C. 154(b) by 170 days.

(21) Appl. No.: 13/702,387

(22) PCT Filed: May 23, 2011

(86) PCT No.: PCT/EP2011/002551
§ 371 (c)(1),
(2), (4) Date: Feb. 15, 2013

(87) PCT Pub. No.: WO2011/154094
PCT Pub. Date: Dec. 15, 2011

(65) Prior Publication Data
US 2013/0206584 A1    Aug. 15, 2013

(30) Foreign Application Priority Data

Jun. 11, 2010 (DE) .................. 10 2010 023 418

(51) Int. Cl.
C23C 14/00      (2006.01)
C23C 14/32      (2006.01)
(Continued)

(52) U.S. Cl.
CPC ............. *C23C 14/22* (2013.01); *B01J 21/063* (2013.01); *B01J 23/462* (2013.01); *B01J 23/468* (2013.01);
(Continued)

(58) Field of Classification Search
CPC .... C23C 14/325; C23C 14/08; C23C 14/0021
(Continued)

(56) References Cited

U.S. PATENT DOCUMENTS 3,632,498 A    1/1972    Beer
4,544,473 A    10/1985   Ovshinsky et al.
(Continued)

FOREIGN PATENT DOCUMENTS

CN    1226289 A    8/1999
DE    334416       3/1921
(Continued)

OTHER PUBLICATIONS

Zeng Yi, Chen Kangning, Wu Wei, Jianrong Wang, Soowohn Lee, Effect of IrO2 loading on RuO2—IrO2—TiO2 anodes: A study of microstructure and working life for the chlorine evolution reaction, Ceramics International, vol. 33, Issue 6, Aug. 2007, pp. 1087-1091, ISSN 0272-8842.*

(Continued)

*Primary Examiner* — Ibrahime A Abraham
(74) *Attorney, Agent, or Firm* — Lathrop Gage L.L.P.

(57)    ABSTRACT

A method for coating a substrate on one or more sides having catalytically active material producible by material deposition under vacuum in a vacuum chamber, using the following steps: loading a substrate in the chamber evacuating the chamber, cleaning the substrate by introducing a gaseous reducing agent, removing the gaseous reducing agent, applying an intermediate layer by means of vacuum arc evaporation, wherein a substrate comprising the same or (Continued)

similar material is introduced into the vacuum chamber, controlling the chamber temperature, coating by vacuum arc evaporation, a metal taken from the group ruthenium, iridium, titanium and mixtures thereof while oxygen is supplied, in a last step the coated substrate is removed from the chamber, wherein at least 99% of the substrate coating is free of constituents originally contained in the substrate itself, and at least 99% of the coating applied on the intermediate layer is kept free of non-oxidized metals.

14 Claims, 1 Drawing Sheet

(51) Int. Cl.
| | | |
|---|---|---|
| C23C 14/22 | (2006.01) | |
| B01J 21/06 | (2006.01) | |
| B01J 23/46 | (2006.01) | |
| B01J 37/14 | (2006.01) | |
| B01J 37/34 | (2006.01) | |
| C23C 14/02 | (2006.01) | |
| C23C 14/08 | (2006.01) | |
| C23C 14/16 | (2006.01) | |
| C25B 11/04 | (2006.01) | |

(52) U.S. Cl.
CPC ............ *B01J 37/14* (2013.01); *B01J 37/341* (2013.01); *B01J 37/347* (2013.01); *C23C 14/0021* (2013.01); *C23C 14/024* (2013.01); *C23C 14/08* (2013.01); *C23C 14/083* (2013.01); *C23C 14/16* (2013.01); *C23C 14/325* (2013.01); *C25B 11/0478* (2013.01)

(58) Field of Classification Search
USPC .................................................... 204/192.38
See application file for complete search history.

(56) References Cited

U.S. PATENT DOCUMENTS

| | | | |
|---|---|---|---|
| 4,568,568 A | 2/1986 | Asano et al. | |
| 5,317,235 A | 5/1994 | Treglio | |
| 5,868,913 A * | 2/1999 | Hodgson | 204/298.01 |
| 6,017,430 A | 1/2000 | Hodgson et al. | |
| 6,282,774 B1 | 9/2001 | Borucinski et al. | |
| 6,673,127 B1 | 1/2004 | Allen et al. | |
| 2010/0092692 A1 | 4/2010 | Dulle et al. | |

FOREIGN PATENT DOCUMENTS

| | | |
|---|---|---|
| DE | 1671422 | 6/1971 |
| DE | 2734084 | 2/1978 |
| DE | 2811472 | 9/1978 |
| DE | 3118320 | 4/1982 |
| DE | 3232809 | 3/1983 |
| DE | 3322169 | 1/1985 |
| DE | 3344416 | 12/1985 |
| DE | 102006057386 | 6/2008 |
| EP | 0129088 | 12/1984 |
| EP | 437178 A1 | 9/1995 |
| EP | 1624087 | 2/2006 |
| WO | 9505499 | 2/1995 |
| WO | 9807899 A1 | 2/1998 |
| WO | 9815675 | 4/1998 |
| WO | 2008067899 | 6/2008 |

OTHER PUBLICATIONS

Machine translation of EP0129088.*
International Search Report for PCT/EP2011/002551, English translation attached to original, Both completed by the European Patent Office dated Aug. 24, 2011, All together 7 Pages.

* cited by examiner

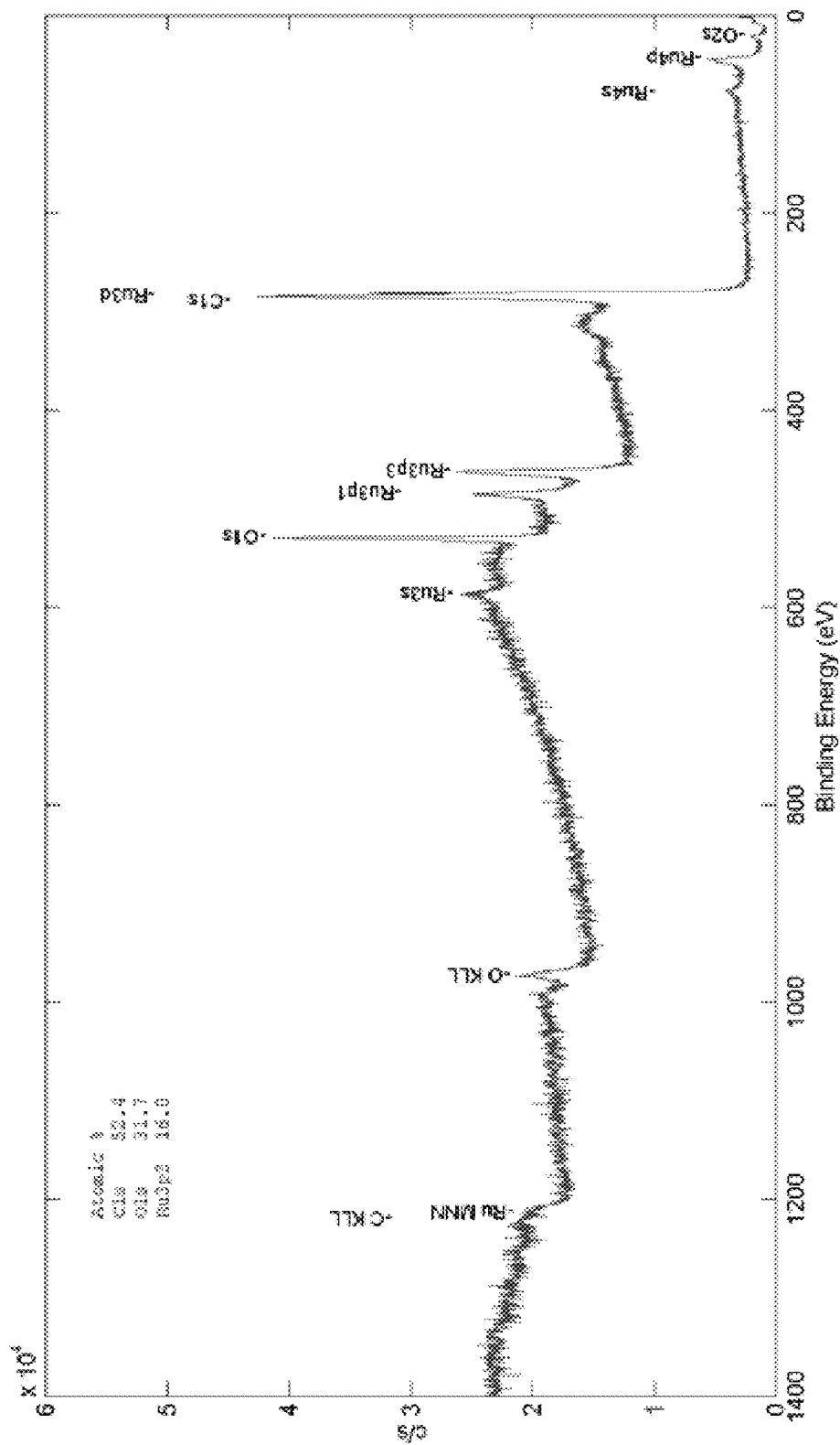

SUBSTRATE COATING ON ONE OR MORE SIDES

CROSS-REFERENCE TO RELATED APPLICATION

This application is the U.S. national phase of PCT Appln. No. PCT/EP2011/002551 filed on May 23, 2011, which claims priority to German Patent Application No. 10 2010 023 418.4 filed on Jun. 11, 2010.

The invention relates to a method for coating one or more sides of substrates with catalytically active material, comprising material deposition under vacuum in a vacuum chamber, wherein the following steps are performed:
- (a) loading the vacuum chamber with at least one substrate,
- (b) closing and evacuating the vacuum chamber,
- (c) cleaning the substrate by introducing a gaseous reducing agent into the vacuum chamber,
- (d) removing the gaseous reducing agent,
- (e) applying an intermediate layer by means of vacuum arc deposition, wherein a substrate comprising the same or similar material is introduced into the vacuum chamber,
- (f) setting the vacuum chamber to a temperature of 150° C. to 400° C.,
- (g) applying a coating by means of vacuum arc deposition, wherein at least one metal taken from the group of ruthenium, iridium, titanium and mixtures thereof is introduced into the vacuum chamber and oxygen is supplied throughout the coating period,
- (h) in a last step the vacuum chamber is re-flooded and the coated substrate is removed from the chamber,
  wherein the above steps and transitions from one step to the next are performed under vacuum applying different pressures if appropriate, which are set by means of a protective gas.

Electrodes used in the chlor-alkali electrolysis are to be coated with a catalytically active layer. These coatings are implemented by established spray, immersion or mechanical application processes.

To improve the electrode quality, DE 3118320A1 proposes to apply a multi-component alloy consisting of at least two different components onto a carrier made of an electrically conductive material under vacuum by means of spraying, vapour deposition or plasma vapour deposition in such a way that the coating is amorphous and has active centres across the entire accessible surface. This coating can consist of a transition metal such as nickel, vanadium, titanium, chromium, cobalt, niobium, molybdenum and tungsten, the said transition metal containing small amounts of noble metals such as ruthenium, platinum or palladium. The amorphous and active structure of the surface is obtained by leaching or evaporating elements also applied during coating such as lithium, boron, carbon, nitrogen, oxygen, aluminium, silicon, zinc and subsequent annealing.

Substrate coating consisting of tungsten, tungsten carbide or mixtures thereof is disclosed in DE 3232809 A1. In addition, at least one of the elements nickel, cobalt, chromium, molybdenum, boron and carbon is contained therein. Sealing of the porous, active layer from the substrate is effected by impregnation with an acid-resistant fluorine-containing resin.

A known anode coating is known from DE 1671422 A1. Here, titanium anodes are described which are coated with oxides from the group of platinum metals and mixtures containing metals which can be passivated, e.g. a mixture of 30 mole percent ruthenium oxide and 70 mole percent titanium oxide.

Cathode coatings from metallic ruthenium, with a metal layer enclosing the carrier body being produced by galvanic deposition or by a CVD process, are described in DE 2734084 A1.

In another process, a ruthenium-containing layer is produced on the carrier body by electrolytic coating or by thermal decomposition of salt-bearing precipitated products. In DE 2811472 A1 the carrier surface is coated with a ruthenium compound, then the solvent is evaporated and the compound is decomposed in a non-oxidising atmosphere.

DE 3322169 C2 claims a cathode coating of a carrier, wherein the coating is a platinum metal-containing layer, and the layer consists of several partial layers containing ruthenium oxide and nickel oxide, and the mass ratio of the oxides varies in the individual partial layers of the layer.

DE 3344416 C2 as well discloses a process for the production of an electrode comprising a coating made of a mixture of ruthenium oxide and nickel oxide. In this, a carrier is treated with a solution containing a substance for dissolving ruthenium salts and nickel as a result of which part of the nickel contained in the carrier is dissolved and ruthenium salts and nickel salts deposit on the carrier by evaporation of the solvent. Heating of the carrier in an oxygen-containing atmosphere gives a coating made of ruthenium oxide and nickel oxide.

WO95/05499 discloses a method for the production of an electrode from a substrate made of metal and a coating of at least one outer layer made of an electrocatalytically active material comprising a mixture of ruthenium oxide and a non-noble metal, wherein this mixture is applied by a physical vapour deposition process (PVD process). Pre-treatment of the substrate surface is also provided, sand-blasting or an acid treatment being proposed as methods. The person skilled in the art knows that such pickling of the surface causes migration of constituents initially contained in the substrate—by means of diffusion—to an applied coating. This causes a homogeneous distribution of the catalyst in the coating, as a result of which a mixture of coating constituents and substrate constituents is obtained.

DE 10 2006 057386 A1 discloses a physical vapour deposition process (PVD process), wherein in a first step a vacuum chamber is loaded with a substrate. After evacuation of the vacuum chamber the substrate is cleaned by introducing a gaseous reducing agent into the vacuum chamber. Moreover, the substrate surface is increased in size by depositing a vaporous component on the substrate surface. Coating is performed by one of the known processes such as plasma coating processes, physical gas deposition, sputtering processes or the like and may consist of one or more metals or their oxides. Depending on how the process is run, an oxidising gas can be introduced into the vacuum chamber during the whole or part of the coating period so that primarily coatings are produced which contain both metals and their oxides.

Based on the cited state of the art there is a further demand for an identification of improved electrode coatings featuring further reduced cell voltages to ensure a more economical mode of operation. The aim of the present invention is to provide an alternative substrate coating with optimised properties.

Surprisingly, it was found that coatings which are largely free of substrate constituents on the one hand and are also largely free of non-oxidised metals on the other hand, have a positive effect on the cell voltage of an electrolyser cell.

The person skilled in the art would not expect this because, as shown at the beginning, in prior art migration of substrate constituents is initiated on purpose or mixtures of different compositions which also contain substrate constituents are applied directly. Moreover, nowhere in prior art has it been emphasized that pure metal oxide layers have particularly positive effects on the cell voltage.

The invention relates to a method for coating one or more sides of substrates with catalytically active material, comprising material deposition under vacuum in a vacuum chamber, wherein the following steps are performed:

(a) loading the vacuum chamber with at least one substrate,
(b) closing and evacuating the vacuum chamber,
(c) cleaning the substrate by introducing a gaseous reducing agent into the vacuum chamber,
(d) removing the gaseous reducing agent,
(e) applying an intermediate layer by means of vacuum arc deposition, wherein a substrate comprising the same or similar material is introduced into the vacuum chamber,
(f) setting the vacuum chamber to a temperature of 150° C. to 400° C.,
(g) applying a coating by means of vacuum arc deposition, wherein at least one metal taken from the group of ruthenium, iridium, titanium and mixtures thereof is introduced into the vacuum chamber and oxygen is supplied throughout the coating period,
(h) in a last step the vacuum chamber is re-flooded and the coated substrate is removed from the chamber, wherein the above steps and transitions from one step to the next are performed under vacuum applying different pressures if appropriate, which are set by means of a protective gas, wherein at least 99% of the substrate coating on one or more sides are kept free of constituents initially contained in the substrate, wherein at least 99% of the coating applied onto the intermediate layer are kept free of non-oxidised metals.

In this, the intermediate layer generated in process step (e) is preferably made of metals taken from the group of ruthenium, iridium, titanium and mixtures thereof. Another advantageous operating mode is that the oxygen supply of process step (g) is performed in a pulsed manner.

In a preferred embodiment of the invention the substrate coating is completely kept free of constituents initially contained in the substrate and the coating applied onto the intermediate layer is completely kept free of non-oxidised metals. This means that when conducting the process the individual process steps stop migration of constituents initially contained in the substrate to the applied layers. In addition, oxygen is supplied in such a quantity that the applied layer is a pure metal oxide layer. In this way, a mixture of metal/metal oxide and substrate constituents in the outer coating is avoided.

The term "completely free" is understood to mean that this falls within the scope of technical limits of detection of the defined measuring methods known from state of the art. The determination of the technical features of the characterising part of the main claim was proved by means of XPS spectroscopy (XPS system of Physical Electronics (PHI 5800 ESCA SYSTEM)).

In the process used to produce the substrate coating, the above steps and transitions from one step to the next may be performed under vacuum by applying different pressures if appropriate. Thus, the substrate never leaves the vacuum and the formation of intermediate oxidic layers or deposit of new dirt is successfully prevented. Furthermore, the before-mentioned deposition process under vacuum serves to produce a homogeneous substrate surface that can be reproduced at any time.

Surprisingly, it was found that the adjustment of the temperature to values between 150° C. and 400° C. during the coating process in the presence of oxygen has a positive effect on the reaction of elementary ruthenium with oxygen and there is a positive effect on the formation of coatings which are largely free of non-oxidised metals and intended to be applied onto the intermediate layer according to the invention.

The vacuum arc deposition process is used to apply the coating. Surprisingly, it turned out that this process is particularly suited for the production of pure metal dioxide layers. In this, local deposition takes place in the arcing ends of a cathode arc which burns in the vapour generated by the arc itself. It is known from state of the art that this process is characterised by a high deposition rate of approx. 100 nm/min. This method is described, for example, in U.S. Pat. No. 5,317,235. It discloses an arc metal deposition apparatus that prevents the deposition of metal droplets with the metal ions being deposited.

The substrate is preferably selected from a group comprising stainless steel and elements of the nickel group as well as coated stainless steel from elements of the nickel group.

The coating applied onto the intermediate layer is advantageously made of ruthenium dioxide. Optionally, this coating is made up of a mixture of the metal oxides of ruthenium dioxide:iridium dioxide:titanium dioxide.

The intermediate layer according to the invention preferably features uneven areas on its surface. As a result, this will lead to surface enlargement of the substrate which is achieved by deposition of a vaporous component. In this, the material to be applied is ideally identical to the substrate material. Uneven areas of such kind can also exist on the coating applied onto the intermediate layer.

The known process of vacuum deposition involves the great advantage that the surface is not covered and the existing intended roughness is thus not levelled again but insular, spotted peaks are generated which constitute an actual surface enlargement and provide excellent adhesive conditions for the subsequent rather planar layer.

Advantageously, the substrate coating, consisting of an intermediate layer and a coating applied to it, has a layer thickness of 1 to 50 μm, preferably 1 to 30 μm, particularly preferably 1 to 10 μm and most preferably 1.5 to 2.5 μm.

The method can be improved in such a way that the coating step (g) or the removing step (h) is followed by a thermal treatment of the coated substrates at a temperature between 350° C. and 650° C. This thermal treatment, in which intercrystalline processes take place that shall here not be described in more detail, will improve the long-term bonding strength of the coating.

The method embodying the invention may also be complemented in such a way that under atmospheric conditions and prior to the first step (a) one or more process steps for the increase of the size of the surface, structural shaping and/or cleaning of the surface are performed. In the ideal case, mechanical processes such as a sandblasting process and/or a chemical process such as an etching process, for example, are used for this purpose. Depending on the previously applied treatment, the substrate surface is subsequently cleaned for the first time and/or dried.

The present invention is illustrated in detail below by means of FIG. 1. It shows:

FIG. 1: XPS spectrum of a cathode coating embodying the invention

In an experiment, a nickel cathode of 2.7 m² as described in WO 98/15675 A1 was loaded as substrate into a vacuum chamber. In the chamber, the substrate was exposed to a mixture of argon and hydrogen and thus pre-cleaned. In a first step, the chamber was evacuated ($10^{-5}$ bar). Subsequently, the oxide layer was reduced by introducing hydrogen at 250-350° C. Then, the size of the surface was increased. Elementary nickel served as a material source which corresponded to the material of the substrate. By means of vacuum arc deposition with a ~$10^{-5}$ bar vacuum and a chamber temperature of 250-350° C. this nickel was deposited as intermediate layer on the substrate until the surface had increased to ~50 times the size.

Subsequently, the intermediate layer was provided with a coating made of ruthenium dioxide by means of vacuum arc deposition, wherein oxygen was introduced into the vacuum chamber in a pulsed manner throughout the coating period. In so doing, work was carried out at a temperature of 300° C. In this manner ruthenium dioxide produced in situ was, as expected, deposited onto the intermediate layer as disclosed in WO 08/067899 A1.

This produces a substrate coating which is free of substrate constituents as shown in FIG. 1 by means of an XPS spectrum. This means, the gentle application method prevents the substrate constituents from migrating into the substrate coating. In addition, the coating applied onto the intermediate layer completely consists of ruthenium dioxide and is not contaminated with non-oxidised substrate.

Surprisingly, it was found that this special substrate coating which comprises a metallic intermediate layer and a coating free of both substrate constituents and non-oxidised metals, and which must be selected from a plurality of possible coatings covered by WO 08/067899 has a particularly positive effect on the cell voltage. The person skilled in the art would not expect this because, as shown at the beginning, in prior art migration of substrate constituents is initiated on purpose or mixtures of different compositions which also contain substrate constituents are applied directly.

As a comparison experiment, cathodes were used which, in principle, had been produced by the above method. However, the introduction of oxygen was dispensed with in the coating with ruthenium. For this purpose, ruthenium was deposited on the substrate for more than two minutes and only then a re-oxidation was carried out by introducing oxygen. As a result, however, no completely pure ruthenium dioxide layer can be achieved. The coating rather consists of a mixture of ruthenium dioxide and elementary ruthenium.

In addition, commercially available cathodes were used which are available according to the state of the art disclosed in DE 3322169 C2 and DE 334416 C2.

For carrying out the experiment, an electrolyser was equipped with 15 elements of a size of 2.7 m². In this, use was made of 15 anodes of the same type (C-sections), 15 membranes of type N2030 and 11 cathodes with commercial coating, i.e. either according to DE 3322169 C2 or to DE 334416 C2 or to WO08/067899, and four cathodes provided with the coating embodying the invention without substrate constituents and without non-oxidised metals.

On the anode side, the plant was operated with 205 g/l NaCl solution and on the cathode side with 32 weight percent caustic soda solution. The electrolyser was operated at a current density of 6 kA/m² and a temperature of 88° C. over a period of 75 DOL. As regards the cell voltage, stationary operation was achieved after 50 DOL.

Surprisingly, a cell voltage reduced by 30 mV (standardised to 90° C., 32 weight percent NaOH and 6 kA/m²) could be achieved in the case of the four elements provided with the substrate coating embodying the invention as compared to the 11 elements with the commercial coating selected, thus resulting in a much more economical mode of operation of the electrolysers.

The invention claimed is:

1. A method for coating one or more sides of substrates with catalytically active material, comprising material deposition under vacuum in a vacuum chamber, wherein the following steps are performed:
    loading the vacuum chamber with at least one substrate, closing and evacuating the vacuum chamber,
    cleaning the substrate by introducing a gaseous reducing agent into the vacuum chamber,
    removing the gaseous reducing agent,
    applying an intermediate layer by means of vacuum arc deposition, wherein a substrate comprising the same material as the intermediate layer is introduced into the vacuum chamber,
    applying a coating by means of vacuum arc deposition at a temperature of 150° C. to 400° C., wherein at least one metal taken from the group of ruthenium, iridium, titanium and mixtures thereof is introduced into the vacuum chamber and oxygen is supplied throughout the coating period,
    in a last step the vacuum chamber is re-flooded and the coated substrate is removed from the chamber;
    wherein the above steps and transitions from one step to the next are performed under vacuum which is set by means of a protective gas,
    wherein migration of atoms from the intermediate layer into an outer layer of the coating on the intermediate layer is avoided, and
    wherein at least 99% of the intermediate layer on one or more sides is kept free of constituents initially contained in the substrate, wherein at least 99% of the intermediate layer is kept free of non-oxidised metals; and
    wherein a substrate coating, consisting of the intermediate layer and the coating applied to it, has a layer thickness of 1.5 to 2.5 μm.

2. The substrate coating method according to claim 1, wherein the intermediate layer is completely kept free of constituents initially contained in the substrate and the coating applied onto the intermediate layer is completely kept free of non-oxidised metals.

3. The substrate coating method according to claim 1, wherein the substrate is selected from a group comprising stainless steel and elements of the nickel group as well as coated stainless steel from elements of the nickel group.

4. The substrate coating method according to claim 1, wherein the coating applied onto the intermediate layer consists of ruthenium dioxide.

5. The substrate coating method according to claim 1, wherein the coating applied onto the intermediate layer is made up of a mixture of the metal oxides of ruthenium dioxide:iridium dioxide:titanium dioxide.

6. The substrate coating method according to claim 1, wherein the intermediate layer features uneven areas on its surface.

7. The substrate coating method according to claim 1, wherein the coating applied onto the intermediate layer features uneven areas on its surface.

8. A substrate comprising a substrate coating on one or more sides of the substrate, the substrate coating comprising an intermediate layer and a coating on the intermediate layer, the substrate prepared by a process comprising material deposition under vacuum in a vacuum chamber avoiding migration of atoms from the intermediate layer into an outer layer of the coating on the intermediate layer, wherein the following steps are performed:

loading the vacuum chamber with at least one substrate, closing and evacuating the vacuum chamber, cleaning the substrate by introducing a gaseous reducing agent into the vacuum chamber, removing the gaseous reducing agent, applying an intermediate layer by vacuum arc deposition, wherein a substrate comprising the same material of the intermediate layer is introduced into the vacuum chamber, applying a coating by vacuum arc deposition at a temperature of 150° C. to 400° C., wherein at least one metal taken from the group of ruthenium, iridium, titanium and mixtures thereof is introduced into the vacuum chamber and oxygen is supplied throughout the coating period, and in a last step the vacuum chamber is re-flooded and the substrate comprising the substrate coating is removed from the chamber, wherein the above steps and transitions from one step to the next are performed under vacuum which is set by means of a protective gas, wherein at least 99% of the intermediate layer is kept free of constituents initially contained in the substrate, and wherein at least 99% of the intermediate layer is kept free of non-oxidised metals; and wherein the substrate coating, consisting of the intermediate layer and the coating applied to it, has a layer thickness of 1 to 30 µm.

9. The substrate according to claim 8, wherein the substrate coating is completely kept free of constituents initially contained in the substrate and the coating applied onto the intermediate layer is completely kept free of non-oxidised metals.

10. The substrate according to claim 8, wherein the substrate is selected from a group comprising stainless steel and elements of the nickel group as well as coated stainless steel from elements of the nickel group.

11. The substrate according to claim 8, wherein the coating applied onto the intermediate layer consists of ruthenium dioxide.

12. The substrate according to claim 8, wherein the coating applied onto the intermediate layer is made up of a mixture of the metal oxides of ruthenium dioxide:iridium dioxide:titanium dioxide.

13. The substrate according to claim 8, wherein the intermediate layer features uneven areas on its surface.

14. The substrate according to claim 8, wherein the coating applied onto the intermediate layer features uneven areas on its surface.

* * * * *